United States Patent
Guldi et al.

[19]

[11] Patent Number: 6,067,163
[45] Date of Patent: May 23, 2000

[54] AUTOMATED SUBSTRATE PATTERN RECOGNITION SYSTEM

[75] Inventors: Richard L. Guldi, Dallas; Douglas E. Paradis, Richardson, both of Tex.

[73] Assignee: Texas Instruments Incorporated, Dallas, Tex.

[21] Appl. No.: 08/732,792

[22] Filed: Oct. 15, 1996

Related U.S. Application Data

[60] Provisional application No. 60/007,094, Oct. 31, 1995.

[51] Int. Cl.[7] .................................................. G01N 11/00
[52] U.S. Cl. ........................... 356/394; 356/388; 250/272
[58] Field of Search ..................... 356/401, 386, 356/400, 394; 430/30; 372/57; 250/272, 559.39

[56] References Cited

U.S. PATENT DOCUMENTS

| | | | |
|---|---|---|---|
| 4,656,358 | 4/1987 | Divens et al. | 356/386 |
| 4,795,260 | 1/1989 | Schuur et al. | 356/400 |
| 5,124,927 | 6/1992 | Hopewell et al. | 356/401 |
| 5,260,154 | 11/1993 | Forrest | 430/30 |
| 5,386,430 | 1/1995 | Yamagishi et al. | 372/57 |

*Primary Examiner*—Frank G. Font
*Assistant Examiner*—Roy M. Punnoose
*Attorney, Agent, or Firm*—Robby T. Holland; Mark A. Valetti; Frederick J. Telecky, Jr.

[57] ABSTRACT

The invention provides a process for evaluating a substrate, such as a wafer of semiconductive material having a semiconductor die at least partially formed thereon, as to the condition of an overlying film, such as an overlying film of photoresist that is applied to the semiconductor die prior to metal etching and ion implantation. The condition of the film is evaluated by exposing at least a portion of the substrate to electromagnetic radiation and evaluating the wave profile of the reflected beam.

In instances where it is desirable to evaluate the substrate for the presence or absence or photoresist, ultraviolet, or near ultraviolet light having a wavelength of about 240–650 nm can be used, as such wavelengths are strongly absorbed by photoresist. In contrast, areas of the substrate that are not covered by photoresist will not significantly absorb ultraviolet or near ultraviolet radiation. The presence or absence of the film under study can be evaluated by detecting reflected light from the substrate and comparing the detected light to a known profile. When photoresist films are under evaluation, the profile will feature portions of relatively low amplitude, which correspond to absorption of uv due to the presence of photoresist, and portions of relatively high amplitude, which correspond to non-absorption (reflectance) of uv. While the principles of the invention are applicable to single-point testing of a substrate, it is preferable to undertake a multi-point, and more preferably a continuous scan, of at least a portion of the substrate to minimize the occurrence of possibly erroneous results, as could occur from sampling a portion of the substrate that was deliberately not patterned with the film under study.

17 Claims, 3 Drawing Sheets

006,067,163

AUTOMATED SUBSTRATE PATTERN RECOGNITION SYSTEM

This application claims priority under 35 USC §119(e)(1) of provision application Ser. No. 60/007,094, filed Oct. 31, 1995.

TECHNICAL FIELD OF THE INVENTION

The invention relates generally to semiconductor processing, and more particularly to methods and apparatus for evaluating semiconductor wafers to detect the presence of process-related defects at the surface of a semiconductor wafer.

BACKGROUND OF THE INVENTION

Considerable efforts are expended by semiconductor manufacturers to improve product yield and reduce the frequency of defects in product manufacture. Difficulties in increasing product yield are exacerbated by the marketplace demand for technologically advanced product at reduced prices. For all but a narrow group of specialty product manufacturers, profits are obtained through high volume sales rather than through high profit margins. Accordingly, loss of product yield due to errors of manufacture, wafer mishandling and the like impact significantly upon the overall commercial success of the product.

Product yield loss can be experienced at virtually any stage of semiconductor processing. For example, loss can occur as a result of the failure to fully incorporate a process step into the manufacture of the semiconductor device, a deviation from established processing regimen, the use of defective reagents, problems in reagent application or deposition of films, and the like. Such deficiencies are typically not identified until the completion of device manufacture upon random product testing. The identification of a defective product from a given wafer can result in the discard of not only the semiconductor under test, but also the entirety of the wafer and its associated devices, as well as the batch of wafers that were processed in a like manner. Upwards of several thousand (but typically about 200) devices can be manufactured on a single wafer. Moreover, as wafers are typically processed in batches of 15 or more, the identification of a processing defect that relates to the entirety of a batch can result in a considerable economic loss. Further, such end of cycle testing can render it difficult to determine the precise nature of a product defect and the manner and process stage at which the defect was introduced into the wafer. In such instances, not only does the financial loss relate to the inability to sell manufactured product, there are also considerable losses experienced as a result of the expenditure of personnel time, chemical reagents, and processing apparatus on behalf of goods that cannot be commercialized.

In view of the foregoing deficiencies in the prior art of semiconductor processing, it would be desirable to provide semiconductor processing methods and apparatus which allow for the confirmation of properly applied and processed materials, such as patterned photoresist and other applied materials, at various stages of semiconductor processing in a manner which requires minimal interruption, in the processing regimen. Conventional wafer inspection procedures typically involve manually removing an exemplary wafer from its carrier boat and optically sampling a predetermined number of wafer sites to visually evaluate the wafer for the presence of defects. It would also be desirable to provide methods and apparatus for confirming the presence and satisfactory quality of a photoresist pattern and other applied materials which do not require physical contact with the semiconductor device under study. These and other advantages of the methods and apparatus of the present invention will become apparent by reading the following detailed description and drawings.

SUMMARY OF THE INVENTION

The invention provides methods and apparatus for evaluating a substrate, such as a wafer of semiconductive material having a semiconductor die at least partially formed thereon, for the presence of process-related defects. The condition of the substrate is evaluated by exposing the substrate to electromagnetic radiation and evaluating the wave characteristics of the reflected beam. As the inspection is simple and non-invasive, it can be implemented on each wafer of a process lot, preferably prior to each stage of processing and that, to the extent possible, the wafer(s) can be re-worked to correct the abnormality.

In instances where it is desirable to evaluate the substrate for the presence or absence of a photoresist film, ultraviolet or near ultraviolet light having a wavelength of about 240–650 nm can be used, as such wavelengths are strongly absorbed by photoresist. In contrast, areas of the substrate that are not covered by photoresist will not significantly absorb ultraviolet or near ultraviolet radiation. The presence or absence of the film under study can be evaluated by detecting reflected light from the substrate and comparing the detected light to a known profile or to other wafers in a given process lot. In instances where photoresist films are under evaluation, the profile will feature portions of relatively low amplitude, which correspond to absorption of uv due to the presence of photoresist, and portions of relatively high amplitude, which correspond to non-absorption (reflectance) of ultraviolet light. The teachings of the present invention permit real time feedback to semiconductor processing personnel, as specific defects can be identified at nearly the time of their introduction, thereby allowing for the implementation of corrective measures to ensure that the defect is not propagated in successive process lots and that, to the extent possible, the wafer(s) can be re-worked to correct the abnormality.

BRIEF DESCRIPTION OF THE DRAWINGS

Embodiments of the invention have been chosen for purposes of illustration and description, and are shown with reference to the accompanying drawings, in which.

DETAILED DESCRIPTION OF PREFERRED EMBODIMENTS

Figure 1:
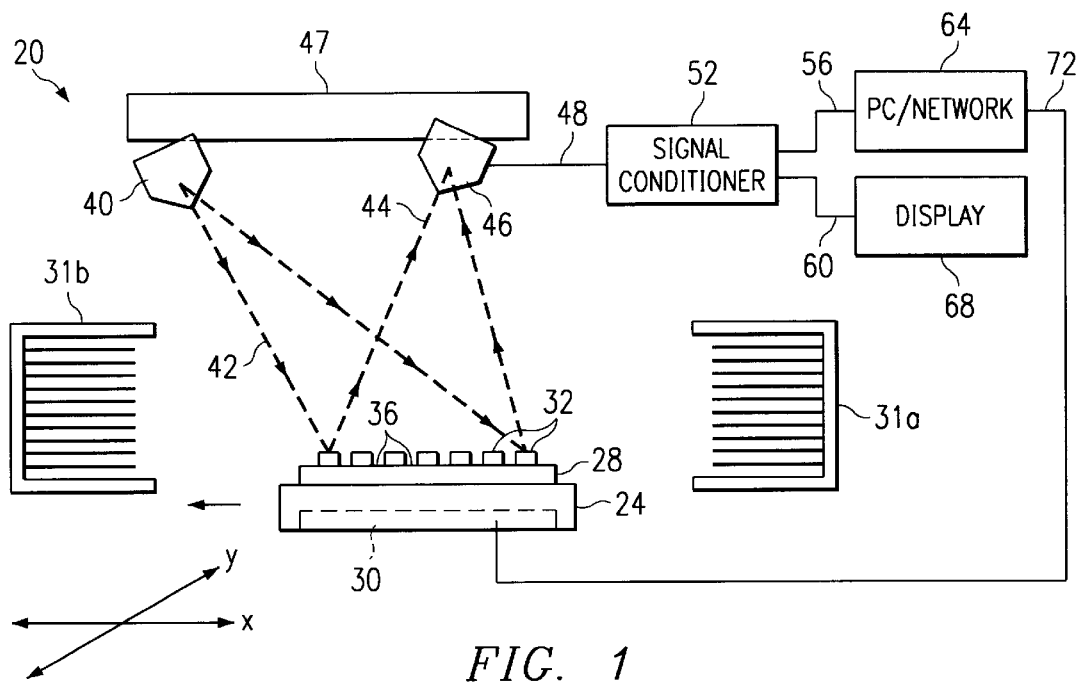
FIG. 1 is a side view of an apparatus for evaluating the condition of a substrate in accordance with the present invention.

With reference to the drawings, wherein like characters represent corresponding parts throughout the various illustrations, and with particular reference to FIG. 1, there is illustrated in schematic form a defect detection system, which is designated generally by reference character 20, that is particularly advantageous for use in the processing of semiconductors. As will be explained in greater detail below, the detection system 20 can be used following a multitude of process stages to provide, from a signal snapshot image or from a composite of multiple snapshot images or optical scan across the wafer surface, for the identification of process and structure-related defects. Identification of such manufacturing problems allows for the correction of processing equipment and/or processing techniques, even during the course of a production run (i.e., "real time" correction), thereby minimizing product loss.

The detection system 20 is comprised generally of a displaceably mounted stage, robot or belt conveyor 24, which is provided to support a wafer 28, as illustrated in the drawing. The stage 24 is preferably coupled to an appropriate drive system 30 such as a stage motor or belt conveyor drive that is operable to linearly displace the stage along a horizontal axis in the direction of the depicted arrow. As will be described in more detail below, the invention encompasses the selection and placement onto the stage 24 of a wafer that is representative of a batch of wafers that are at a common stage of wafer processing. Typically, such wafers are received within wafer carrier, such as pre- and post-inspection wafer carriers 31a and 31b, respectively, which are used to transport the wafers between processing stations. Appropriate wafer transfer apparatus, such as robotic manipulators (not shown) and the like, can be used to transfer wafers 28 to and from the transfer stage 24.

Arranged on each wafer 28 is a plurality of dies 32 that can optionally be separated from one another by scribe streets 36, as shown in the drawing. The dies 32 are typically arranged in an organized, grid-like pattern along an upper surface of the wafer, as is understood in the art. A light source 40 is provided to illuminate the dies 32 with a light beam 42 having a prescribed wavelength or band of wavelengths. In instances where a developed photoresist is to be evaluated, ultraviolet or near ultraviolet light is desirable because such wavelengths are highly absorbed by the developed photoresist. In a preferred aspect of the invention, a light source such as a mercury vapor light source which is capable of emitting light within a wavelength range of about 240–650 nm is employed to evaluate the wafer dies 32 for the presence of a developed photoresist pattern. At least a portion of the light beam 42 is reflected as a reflected beam 44 from the surface of the wafers 32 and is received by a detector 46 such as a video camera that is operable to generate a signal output indicative of the reflected beam. The light source 40 and the detector 46 can optionally be secured to a common support surface 47 (as shown) to maintain a predetermined spatial relationship between the light source, detector and wafer to be evaluated.

Signal output from the detector 46 is directed along path 48 to a signal conditioner 52 that is itself operable to process the detector output signal and generate separate, related outputs that are directed along lines 56 and 60 to PC/network 64 and (optionally) a signal display 68, respectively. The signal conditioner 52 is preferably in the form of automated signal processing circuitry that can be configured as a free-standing component or as a component or subsystem of a computer. Signal output from the conditioner 52 to the signal display 68 allows for the generation of suitable visually and/or audibly perceptible signals or alarms in instances where the signal output along line 60 corresponds to a detected beam 44 having undesirable attributes, such as unduly high amplitude or reflectance in instances where the presence of a patterned photoresist is desired. Other attributes that can be monitored and which can give rise to generation of an appropriate signal indicia include the identification of "abnormal" or "undesirable" features in the spatial pattern of the reflected light from the wafer. Signal output from the conditioner 52 to the PC/network 64 comprises signal data relating to the reflected light intensity (amplitude) that is received at the detector 46 from the wafer 28 as a wafer under test is evaluated in one or both of the x-y direction, as will be described in greater detail below.

More particularly, the signal conditioner 52 is operable to evaluate the emitted detector signal for the presence of various types of relatively "coarse" defects (i.e., >~1 micron). Once identified, the appropriate origin of such defects can be modified or otherwise corrected so as to inhibit the proliferation of the same or related defects in successive wafer lots. The detector output signal can be compared to a reference standard, such as that which can be obtained from a "golden lot" (i.e., ideal process condition environment) sample. Alternatively, the output signal can be compared to the signal obtained from a prior sampled wafer or other portion of the same wafer, such as gray level variance across the wafer. The foregoing output signal data can be used to provide an indication of, for example, the effect abnormal or undesired processing conditions may have had on the spatial integrity of the photoresist pattern, or the effect that running process parameter modifications may have had on the incidence of defect generation.

Figure 2A:
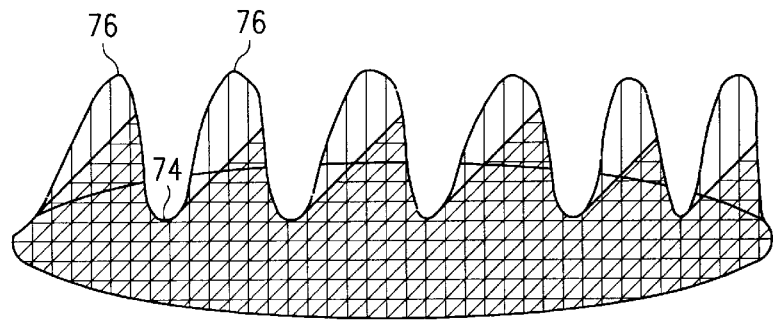
FIGS. 2A & 2B are illustrative examples of detector signal traces indicative of the surface condition a substrate.
Figure 2B:
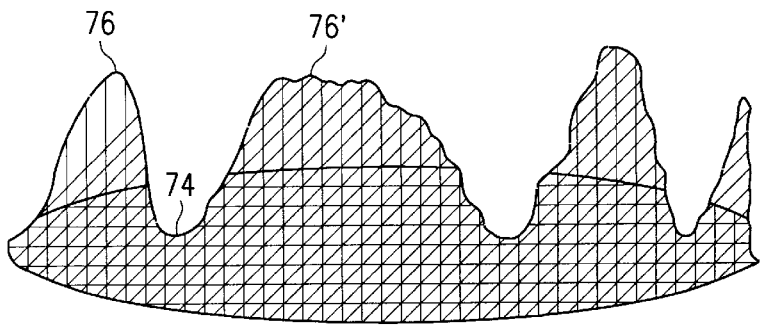

The output signal can be in the form of signals indicative of 2- or 3-dimensional bit-maps, as shown in FIGS. 2A and 2B. For example, FIG. 2A illustrates the periodicity (in simplified form) in wave output that would be expected for a "normal" wafer following a deposition step, such as patterning and development of photoresist, where the graph "valleys" 74 represent areas of light absorption (i.e., non-reflectance), whereas the "peaks" 76 represent areas where light was not absorbed, such as would occur in wafer scribe streets where patterned developed photoresist is not ordinarily present. FIG. 2B, in contrast, is characterized by a lack of periodicity due to the presence of a process defect, manifested by the presence of a broad area of abnormal reflectance of irregular shape. Such signal patterns could occur in instances where a process void or scratch appears on the wafer, as wafer processing material such as photoresist that would ordinarily be present to absorb light, is not present at the portion of the wafer represented by the broad central peak of the bit-map, designated by reference number 76'. It will be appreciated that various types of defects exhibit characteristic bit-map signatures based upon the manner and extent to which they absorb and reflect light. As such, the present invention provides an association of a bit-map to a specific type of defect which, in turn, permits for the implementation of corrective measures, even as a running process modification, to inhibit proliferation of the defect in successive wafer lots.

Figure 3:
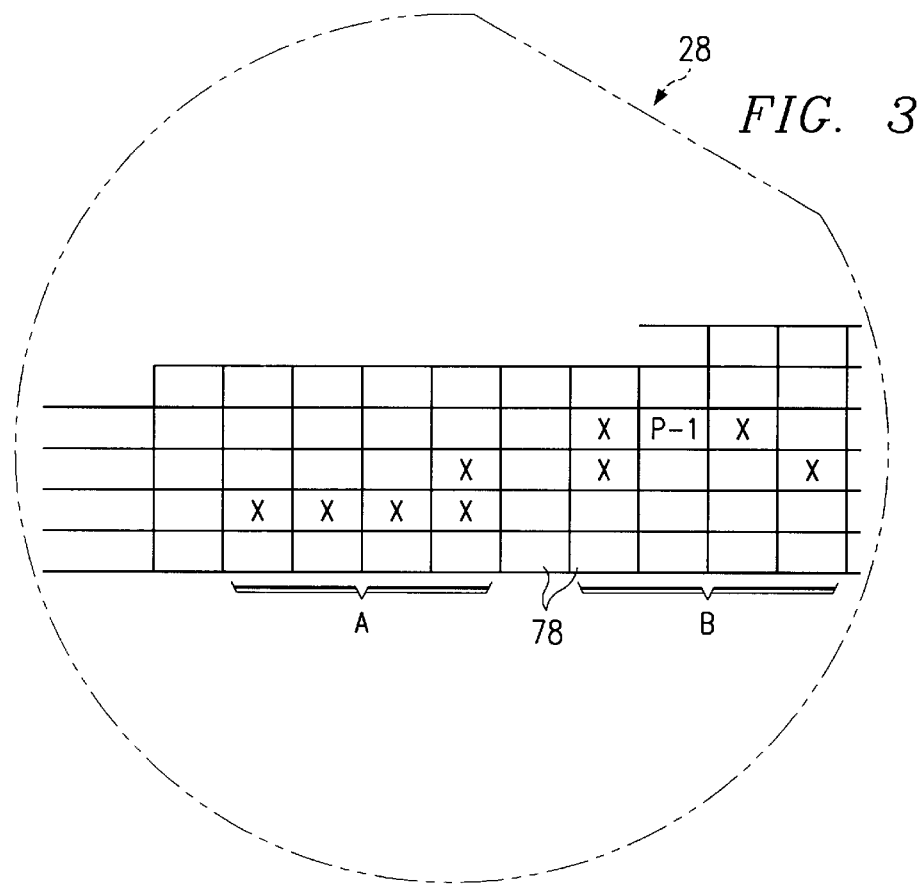
FIG. 3 is a representation of a wafer image that is broken down into a plurality of pixels.

An alternative form of signal conditioner output provides representation of the image as a plurality of pixels 78. Such a representation allows for evaluation of the wafer image on a pixel-by-pixel basis. In such instances, identification of a pixel having, for example, an abnormal or unexpected reflectivity (designated by an "x" in FIG. 3) can initiate a process by which contiguous pixels are evaluated on the basis of an image attribute, such as reflectivity, gray scale, texture, and the like. In instances where contiguous pixels have similar image attributes within a prescribed tolerance band, the pixels can be together associated with a common "flow". This association process is preferably continued at least until no more pixels having the same attribute as the originally-identified abnormal pixel, designated P-1 in FIG. 3, are identified within a prescribed range from the originally identified pixel. In the depicted example, two groups of abnormal pixels, designated as Groups A and B, have been identified and, due to their similar attributes and relative position on the wafer surface, gives rise to their classification as a single defect, such as a scratch or star pattern defect, depending on such factors as the ratio of the defect width-length and position along the surface of the wafer. Specific types of defects can be classified on the basis of the defect dimensions, position on the wafer, attribute value (i.e., "high" or "low" reflectivity, gray scale, etc.), and the like.

PC/network 64 (FIG. 1) can be coupled to the stage drive system 30 by way of signal line 72 to provide stage drive signal input and to otherwise monitor various performance characteristics of the drive system, as is known in the art. Alternatively, the drive system 30 can be operable independent of the PC/network 64 and detection system 20. PC/network 64 is operable to maintain an inspection history database of sampled wafers, identifying them by appropriate indicia such as date, time, process batch number and other appropriate identification and data parameters. This information can be shared with other components of the network by appropriate communication hardware and protocol. Moreover, the PC/network 64 can be operable to transmit a status deficiency or alarm signal allows for the timely implementation of remedial measures to ensure that further faulty photoresist and other patterns under study are not produced. Alternatively, the foregoing status deficiency or alarm signal can be generated by the signal coordinator 52 for communication to the foregoing processing stations. Either of the foregoing status deficiency or alarm signals can be directed to the optional signal display 68 to alert semiconductor processing personnel as to the existence of a possible manufacturing defect in the semiconductor devices 32 of a batch being processed.

Figure 4:
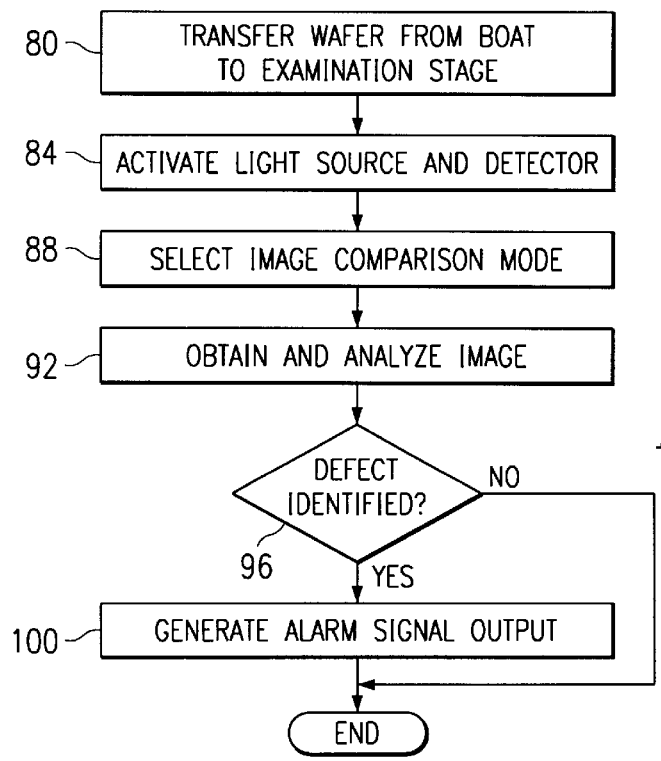
FIG. 4 is a flow diagram of some of the logic steps associated with the practice of the present invention.

The steps involved in the process of the invention are illustrated in FIG. 4. At the outset of this process, wafers 28 that have completed a particular stage of processing, such as conventional photoresist patterning and development, are transferred in an appropriate manner, such as by a robotics transfer system, from their storage receptacle such as a wafer carrier 31a (FIG. 1), to the stage 24 for examination, as indicated by block 80. The transferred wafer 28 can optionally be secured to the stage 24 in an appropriate manner, and can optionally be positioned in a predetermined orientation on the stage 24, such as by alignment of the wafer's flat edge with respect to a suitable reference. Light source 40 is activated (block 84) to generate an incident wafer beam 42, and at least a portion of the incident beam 42 is reflected by the wafer as a beam 44 that is received by detector 46. Relative motion is preferably imparted between the light source/detector and the wafer, as can be accomplished by advancing the wafer 28 in the direction of the arrow in FIG. 1 and/or movement of the light source/detector elements in a similar manner. Illumination of surfaces patterned with photoresist results in the generation of relatively low amplitude signatures of the type illustrated at 74 (FIGS. 2A and 2B) due to the absorption of light by the photoresist, whereas surfaces that are patterned with other materials or otherwise have other materials applied thereon can be expected to exhibit different light absorptive and reflective characteristics which can be utilized to identify relatively coarse defects (process or structure), as has been discussed previously.

An image comparison mode, as indicated by block 88, can be selected incident to wafer processing. A variety of image comparison modes can be provided, such as one which allows for a comparison of each wafer to a "golden lot" wafer image that can be stored in memory, as has been discussed previously. The comparison can be accomplished, for example, on a pixel-by-pixel basis through the use of conventional comparison of a production lot, or even across the surface of a given wafer, without regard to a stored "master" image. Such a "self-comparison" mode could be advantageous in instances where running production changes are incorporated, thus allowing for a continuation of the inspection process without having to interrupt the process cycle. Once a given image comparison mode has been selected, an image is obtained and analyzed (block 92) incident to the detection and identification of defects, as indicated by decision block 96. Image analysis and defect identification arises from an evaluation of the image received by detector 46 based on such factors as absorbency/reflectivity, surface contour, surface boundary (e.g., well-defined image boundary), and the like. Upon detection and, more importantly, identification of the nature of the defect, an alarm or other appropriate indication can be generated (block 100) thereby allowing for modification of an appropriate aspect of the processing regime, ideally "in real time" so as to minimize further product loss that is associated with the defect that has been identified. In the absence of defect identification, the wafers are permitted to transfer to the next scheduled process step, where the foregoing processing can optionally be recommenced, in accordance with the nature of the details and characteristics of that subsequent process step.

Figure 5:
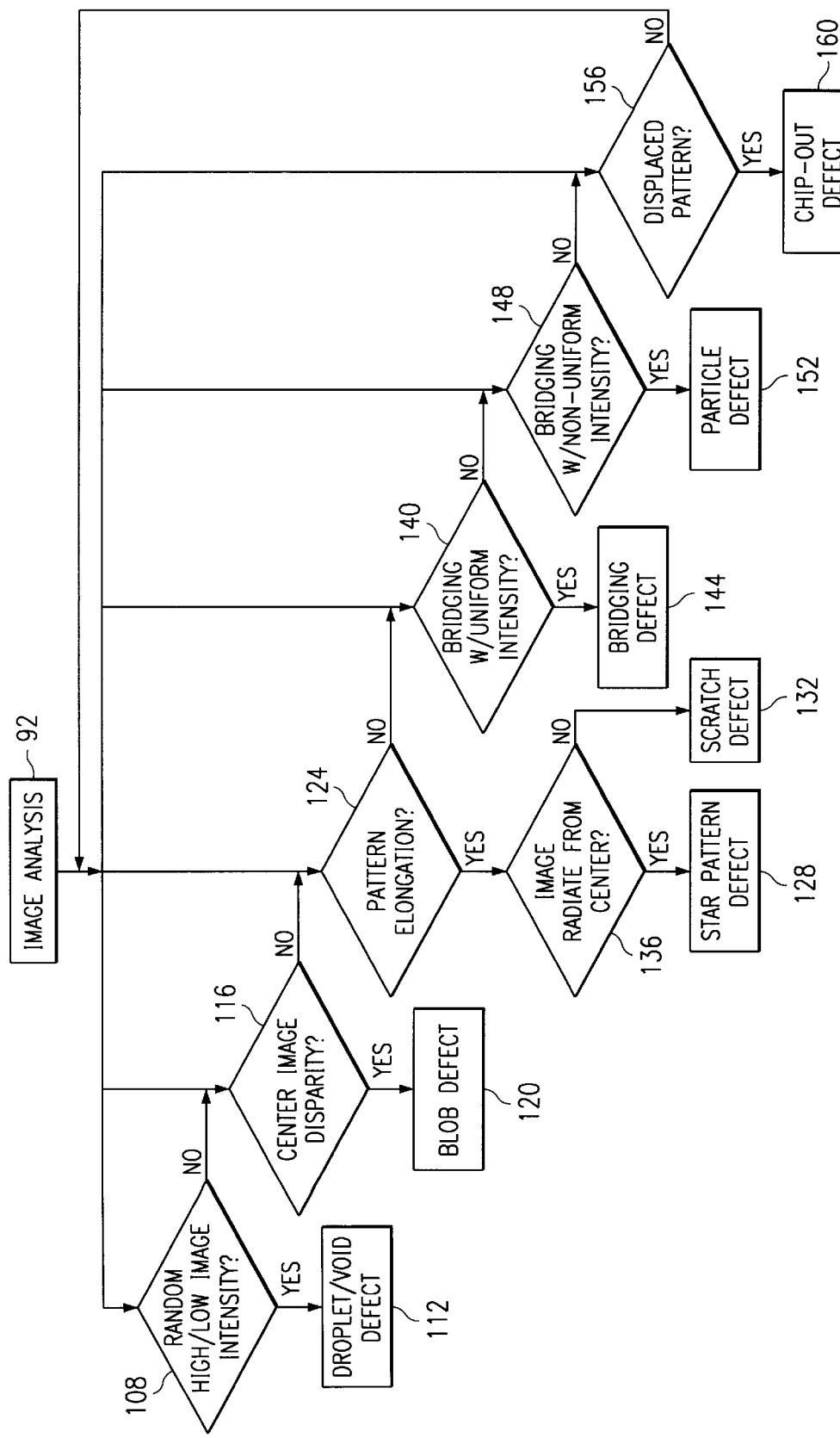
FIG. 5 is a flow diagram illustrating defect identification in accordance with the teachings of the present invention.

Further aspects of image analysis and defect identification that are referenced at blocks 92 and 96, respectively above, are illustrated and discussed in connection with FIG. 5. As is illustrated in the drawing, image analysis involves a multi-faceted inquiry in which the individual inquiry steps or facets are preferably conducted concurrently, although they can also be conducted sequentially. With reference to the drawing, detection of the reflected beam 44 as comprising random high and/or low image intensity (block 108) is indicative of a droplet/void defect as indicated by block 112. In instances where there exists a center image disparity (block 116), such an image is indicative of a "blob" defect as indicated by block 120). An elongated image pattern (block 124) is indicative of either a star pattern defect (block 128) or a scratch defect as indicated by block 132. Whether or not a star pattern or scratch defect is (block 116), such an image is indicative of a "blob" defect as indicated by block 120). An elongated image pattern (block 124) is indicative of either a star pattern defect (block 128) or a scratch defect as indicated by block 132. Whether or not a star pattern or scratch defect is determined depends, in turn, upon a determination as to whether the image radiates from the center (block 136). In instances where the image does radiate from the center, the presence of a "star pattern" defect is identified. If the image does not radiate from the center, the defect is identified as a scratch, as indicated by block 132.

Reflected image 44 having bridging with uniform intensity (block 140) is identified as a bridging defect (block 144). However, instances where bridging is identified with a non-uniform intensity (block 148), the defect is identified as a particle defect as indicated by block 152. In the absence of a bridging/non-uniformity defect, the reflected image 44 is evaluated for the presence of a displaced pattern, as indicated by block 156. In instances where a displaced pattern is identified, the defect is identified as chip-out defect, as indicated by block 160. It is to be appreciated that identification as to the type of defect can, in turn, allow for modification of the appropriate portion of the preceding process to permit for correction of the defect. For example, the existence of a "blob" of material on an evaluated wafer can indicate a malfunctioning applicator nozzle or reagent defect. Likewise, identification of a particle defect can give rise to corrective measures to reduce the incidences of "free" atmospheric particle contaminants in the environment of the wafer processing equipment. Such measures could include, for example, replacement of dirty filters, checking to ensure appropriate equipment seals and openings are intact, and the like. Thus, identification as to the specific type of defect can give rise to highly focused efforts to ensure that the occurrence of such defects is minimized in subsequent wafers and in subsequent wafer lots. This knowledge not only minimizes product waste, but also reduces system down time and personnel expenditures of time and other resources associated with the correction of problems of otherwise unknown origin.

The foregoing process therefore provides a readily implementable and cost-effective process for expediently and non-destructively evaluating semiconductor devices undergoing manufacture at various stages of the manufacturing process. In instances where an unfavorable outcome of this process has been obtained, appropriate measures, such as initial or reapplication of inappropriate material, failure analysis, and the like can be implemented, preferably at a point prior to packaging, thereby avoiding altogether the relatively considerable cost of packaging defective semiconductor devices.

Those skilled in the art to which the invention relates will appreciate that other substitutions and modifications can be made to the described embodiment, without departing from the spirit and scope of the invention as defined by the claims below. For example, the invention can be incorporated into a variety of semiconductor processing steps in addition to the pre-ion implant and metal etch steps discussed above. Moreover, while the forgoing detailed description has been directed to the art of semiconductor manufacture, the teachings of the present invention are likewise applicable to other areas of manufacture, such as metallurgy, the application of finishes and surface coatings, and the like. Lastly, while the use of ultraviolet and near ultraviolet light has been discussed, the teachings of the present invention are applicable to a wide range of visually perceptible and non-visually perceptible wavelengths, particularly when one desires to inspect for the presence of a pattern that is comprised of layers which have strong absorption of light of a particular wavelength range, as is the case with photoresist and its absorption of light in the ultraviolet and near ultraviolet range.

What is claimed is:

1. A process for evaluating the condition of a film on a substrate, comprising the steps of:

exposing a substrate surface to an incident electromagnetic radiation beam along at least one surface point;

generating a reflected beam from said at least one of said surface point, said reflected beam having a characteristic profile;

detecting at least one of said reflected beams;

comparing the profile for each of said detected beams with a reference profile;

imparting relative motion between said substrate and said incident radiation beam and detecting said reflected beam during at least a portion of said relative motion;

and wherein said reflected beam profiles is an amplitude profile and the reference profile is an amplitude profile having a profile section of relatively diminished amplitude.

2. The process according to claim 1, wherein electromagnetic radiation having a wavelength of about 240–650 nm is exposed to said surface.

3. The process according to claim 1, wherein said profile is an amplitude profile.

4. The process according to claim 1, further comprising the step of placing said substrate on a movable stage and displacing said stage along at least one horizontal axis to expose said at least one of said surface point too said electromagnetic radiation.

5. The process according to claim 1, wherein said substrate is a wafer of semiconductive material.

6. The process according to claim 1, further comprising the step of directing said substrate to one of a plurality of available stations in accordance with said profile comparison.

7. The process according to claim 1, wherein at least two surface points are exposed to said incident electromagnetic radiation and a reflected beam is generated from at least two of said surface points, and wherein each of said reflected beams has a characteristic profile that is compared with said reference profile.

8. The process according to claim 1, wherein said incident radiation beam is displaced along at least one horizontal axis.

9. The process according to claim 1, further comprising the step of generated an alarm signal if the reflected beam profile differs from said reference profile by an amount in excess of a predetermined threshold value.

10. A process for evaluating the condition of a film layer with respect to an underlying substrate, comprising the steps of:

positioning a substrate having an upper surface onto a stage;

exposing at least a portion of said substrate upper surface to an incident electromagnetic radiation beam while imparting relative motion between said substrate and a source of said electromagnetic radiation;

generating a reflected beam from at least a portion of the substrate surface that is exposed to said incident radiation beam;

detecting at least a portion of said reflected beam;

comparing the profile of the detected beam with a reference profile; and applying incident radiation having a wavelength that is substantially absorbed by said film and substantially reflected by regions of said substrate where said film is not present.

11. The process according to claim 10, wherein said substrate is advanced along at least one horizontal axis while being exposed to said incident beam.

12. The process according to claim 10, wherein electromagnetic radiation having a wavelength of about 240–650 nm is exposed to said substrate surface.

13. The process according to claim 10, further comprising the step of directing said substrate to one of a plurality of available stations in accordance with said profile comparison.

14. The process according to claim 10, wherein said profile is an amplitude profile.

15. The process according to claim 10, further comprising the step of generating an alarm signal if the reflected beam profile differs from said reference profile by an amount in excess of a predetermined threshold value.

16. The process according to claim 10, wherein said substrate is a wafer of semiconductive material.

17. The process according to claim 10, wherein said reflected beam is evaluated for the presence of a recurring pattern that corresponds to reflectance from one of a high reflectivity or low reflectivity region of the substrate surface.

* * * * *